(12) United States Patent
Takeuchi et al.

(10) Patent No.: US 9,953,765 B2
(45) Date of Patent: Apr. 24, 2018

(54) LAMINATED CERAMIC ELECTRONIC COMPONENT MOUNTING STRUCTURE

(71) Applicant: Murata Manufacturing Co., Ltd., Nagaokakyo-shi, Kyoto-fu (JP)

(72) Inventors: Shunsuke Takeuchi, Nagaokakyo (JP); Masashi Nishimura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 49 days.

(21) Appl. No.: 14/702,881

(22) Filed: May 4, 2015

(65) Prior Publication Data
US 2015/0325367 A1    Nov. 12, 2015

(30) Foreign Application Priority Data

May 9, 2014 (JP) .................. 2014-097732
Feb. 26, 2015 (JP) .................. 2015-036267

(51) Int. Cl.
*H01G 4/30* (2006.01)
*H01G 4/228* (2006.01)
(Continued)

(52) U.S. Cl.
CPC .............. *H01G 4/005* (2013.01); *H01G 2/02* (2013.01); *H01G 2/06* (2013.01); *H01G 4/012* (2013.01);
(Continued)

(58) Field of Classification Search
CPC ................... H01G 4/30; H01G 4/228
(Continued)

(56) References Cited

U.S. PATENT DOCUMENTS 6,518,632 B1    2/2003   Yoshida et al.
2007/0135295 A1*  6/2007   Sasabayashi ........ C01G 23/006
                                                  501/138
(Continued)

FOREIGN PATENT DOCUMENTS

CN    1405806 A    3/2003
JP    60-176536 U   11/1985
(Continued)

OTHER PUBLICATIONS

Official Communication issued in corresponding Korean Patent Application No. 10-2015-0053162, dated Apr. 13, 2016.
(Continued)

*Primary Examiner* — Eric Thomas
(74) *Attorney, Agent, or Firm* — Keating & Bennett, LLP

(57) ABSTRACT

A laminated ceramic electronic component mounting structure includes a laminated ceramic electronic component including a ceramic body, first and second inner electrodes in the ceramic body including opposed portions including at least portions of which are opposed to each other in a thickness direction of the ceramic body, a first terminal electrode electrically connected to the first inner electrode, and a second terminal electrode electrically connected to the second inner electrode; and a circuit board including first and second electrode lands electrically connected to the first and second terminal electrodes and on which the laminated ceramic electronic component is mounted, wherein widths of the first and second electrode lands are smaller than widths of the first and second inner electrodes at the opposed portions.

19 Claims, 6 Drawing Sheets

(51) Int. Cl.
    *H01G 4/005*    (2006.01)
    *H01G 2/02*     (2006.01)
    *H01G 4/012*    (2006.01)
    *H01G 4/248*    (2006.01)
    *H05K 1/18*     (2006.01)
    *H05K 1/11*     (2006.01)
    *H01G 4/232*    (2006.01)
    *H01G 2/06*     (2006.01)
    *H01G 4/12*     (2006.01)

(52) U.S. Cl.
    CPC ............. *H01G 4/232* (2013.01); *H01G 4/248* (2013.01); *H05K 1/111* (2013.01); *H05K 1/181* (2013.01); *H01G 4/12* (2013.01); *H01G 4/30* (2013.01); *H05K 2201/10015* (2013.01)

(58) Field of Classification Search
    USPC .................. 361/306.1, 301.4, 760; 174/260
    See application file for complete search history.

(56) References Cited

U.S. PATENT DOCUMENTS

| | | | |
|---|---|---|---|
| 2010/0128413 A1* | 5/2010 | Takashima | H01G 4/012 361/306.3 |
| 2011/0114378 A1* | 5/2011 | Yoshii | H01G 2/065 174/260 |
| 2011/0293894 A1 | 12/2011 | Sato et al. | |
| 2012/0018205 A1 | 1/2012 | Sato et al. | |
| 2012/0019099 A1 | 1/2012 | Sato et al. | |
| 2012/0073100 A1 | 3/2012 | Tsutsumi | |
| 2012/0152604 A1* | 6/2012 | Ahn | H01G 2/065 174/260 |
| 2012/0188682 A1* | 7/2012 | Sato | H01G 4/232 361/305 |
| 2012/0327557 A1* | 12/2012 | Ahn | H01G 4/30 361/321.3 |
| 2013/0056252 A1 | 3/2013 | Fujii et al. | |
| 2013/0200749 A1 | 8/2013 | Nishisaka et al. | |
| 2013/0233606 A1 | 9/2013 | Fujii et al. | |
| 2013/0294009 A1 | 11/2013 | Takeuchi et al. | |
| 2014/0008116 A1 | 1/2014 | Fujii et al. | |
| 2014/0312743 A1 | 10/2014 | Sato et al. | |
| 2014/0332260 A1 | 11/2014 | Sato et al. | |
| 2014/0367152 A1* | 12/2014 | Lee | H05K 1/111 174/260 |

FOREIGN PATENT DOCUMENTS

| | | |
|---|---|---|
| JP | 11-186092 A | 7/1999 |
| JP | 2000-223359 A | 8/2000 |
| JP | 2003-51424 A | 2/2003 |
| JP | 2007-103496 A | 4/2007 |
| JP | 2007-194312 A | 8/2007 |
| JP | 2010-283180 A | 12/2010 |
| JP | 2011-253895 A | 12/2011 |
| JP | 2012-004480 A | 1/2012 |
| JP | 2012-028456 A | 2/2012 |
| JP | 2012-028458 A | 2/2012 |
| JP | 2012-164966 A | 8/2012 |
| JP | 2013-065820 A | 4/2013 |
| JP | 2013-232606 A | 11/2013 |
| KR | 10-2013-0090333 A | 8/2013 |

OTHER PUBLICATIONS

Official Communication issued in corresponding Chinese Patent Application No. 201510231182.8, dated May 24, 2017.
Official Communication issued in corresponding Japanese Patent Application No. 2015-036267, dated Jul. 4, 2017.
Official Communication issued in corresponding Korean Patent Application No. 10-2015-0053162, dated Sep. 13, 2016.
Official Communication issued in corresponding Japanese Patent Application No. 2015-036267, dated Jan. 9, 2018.

* cited by examiner

LAMINATED CERAMIC ELECTRONIC COMPONENT MOUNTING STRUCTURE

BACKGROUND OF THE INVENTION

1. Field of the Invention

The present invention relates to a laminated ceramic electronic component mounting structure.

2. Description of the Related Art

In recent years, laminated ceramic capacitors have been made increasingly larger in capacitance and smaller in size along with the performance enhancement of electronic equipment. A high-dielectric ceramic material, such as barium titanate, is used for the purpose of the large-scale capacitance increase of a laminated ceramic capacitor.

The high-dielectric ceramic material has piezoelectricity and electrostriction. Accordingly, mechanical strain is caused when a voltage is applied to the laminated ceramic capacitor using the high-dielectric ceramic material. The laminated ceramic capacitor vibrates in some cases due to the above-mentioned strain. As the result of the vibration propagating to a circuit board, the circuit board may vibrate at a frequency near 20 Hz to 20000 Hz which is an audible band of frequencies, thus causing noise referred to as acoustic noise.

In the capacitor described in Japanese Patent Laid-Open No. 2013-65820, an electrode land on a circuit board is divided. In addition, the center of an end surface of the capacitor and the electrode land are not joined to each other. Japanese Patent Laid-Open No. 2013-65820 states that a location where the amplitude of the vibration of the capacitor ascribable to the above-described strain is highest is the center of the end surface of the capacitor. Since the location of the capacitor where the amplitude is highest is not joined to the electrode land, the vibration is unlikely to be propagated to the circuit board.

If the electrode land is divided as described in Japanese Patent Laid-Open No. 2013-65820, however, mounting failure may occur if a position where the capacitor is mounted on the circuit board is displaced.

As described above, in recent years, the size of laminated ceramic capacitors has been made increasingly smaller. In a small-sized laminated ceramic capacitor, it is difficult to divide an electrode land since the electrode land is small in area.

SUMMARY OF THE INVENTION

Preferred embodiments of the present invention provide a laminated ceramic electronic component mounting structure capable of reducing noise without the need to divide an electrode land.

A laminated ceramic electronic component mounting structure according to a preferred embodiment of the present invention includes a laminated ceramic electronic component including a ceramic body including first and second principal surfaces extending along lengthwise and widthwise directions of the laminated ceramic electronic component and opposed to each other, first and second side surfaces extending along the lengthwise and thickness directions of the laminated ceramic electronic component and opposed to each other, and first and second end surfaces extending along the widthwise and thickness directions of the laminated ceramic electronic component and opposed to each other, first and second inner electrodes located within the ceramic body and including opposed portions including at least portions of which are opposed to each other in the thickness direction of the ceramic body, a first terminal electrode extending over a range from the first end surface to the second principal surface and electrically connected to the first inner electrode, and a second terminal electrode extending over a range from the second end surface to the second principal surface and electrically connected to the second inner electrode; and a circuit board which includes first and second electrode lands electrically connected to the first and second terminal electrodes and on which the laminated ceramic electronic component is mounted from the second principal surface. The widths of the first and second electrode lands are smaller than the widths of the opposed portions.

In a specific aspect of a laminated ceramic electronic component mounting structure according to various preferred embodiments of the present invention, a pair of widthwise edges of the first electrode land is positioned between a pair of widthwise edges of the opposed portions and a pair of widthwise edges of the second electrode land is positioned between a pair of widthwise edges of the opposed portions in plan view.

In another specific aspect of a laminated ceramic electronic component mounting structure according to various preferred embodiments of the present invention, the first and second terminal electrodes do not extend to the first and second side surfaces of the ceramic body.

In yet another specific aspect of a laminated ceramic electronic component mounting structure according to various preferred embodiments of the present invention, the first and second terminal electrodes do not extend to the first principal surface of the ceramic body.

In still another specific aspect of a laminated ceramic electronic component mounting structure according to various preferred embodiments of the present invention, the first terminal electrode extends over a range from the first end surface of the ceramic body to the first principal surface, and the second terminal electrode extends over a range from the second end surface of the ceramic body to the first principal surface.

In still another specific aspect of a laminated ceramic electronic component mounting structure according to various preferred embodiments of the present invention, the first terminal electrode extends over a range from the first end surface of the ceramic body to the first principal surface and the first and second side surfaces, and the second terminal electrode extends over a range from the second end surface of the ceramic body to the first principal surface and the first and second side surfaces of the ceramic body.

In still another specific aspect of a laminated ceramic electronic component mounting structure according to various preferred embodiments of the present invention, the width of the first terminal electrode is smaller than the widths of the opposed portions and larger than the width of a portion of the first terminal electrode included in the first inner electrode and led out from the opposed portions to be exposed on the first end surface, and the width of the second terminal electrode is smaller than the widths of the opposed portions and larger than the width of a portion of the second terminal electrode included in the second inner electrode and led out from the opposed portions to be exposed on the second end surface.

In still another specific aspect of a laminated ceramic electronic component mounting structure according to various preferred embodiments of the present invention, the first and second terminal electrodes extend to the second principal surface of the ceramic body, the first terminal electrode includes a first overlapping portion overlapping, in plan view, with the opposed portions, a pair of widthwise edges of the first overlapping portion is positioned between a pair of widthwise edges of the opposed portions, the second terminal electrode includes a second overlapping portion overlapping, in plan view, with the opposed portions, and a pair of widthwise edges of the second overlapping portion is positioned between a pair of widthwise edges of the opposed portions.

According to various preferred embodiments of the present invention, it is possible to provide a laminated ceramic electronic component mounting structure capable of reducing noise without the need to divide an electrode land.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1A is a perspective view of a laminated ceramic electronic component mounting structure according to a first preferred embodiment of the present invention, whereas

FIG. 2A is a side cross-sectional view of a laminated ceramic electronic component in the first preferred embodiment of the present invention, whereas

FIG. 4A is a perspective view of a laminated ceramic electronic component mounting structure according to a second preferred embodiment of the present invention, whereas

FIG. 6A is a perspective view of a laminated ceramic electronic component mounting structure according to a third preferred embodiment of the present invention, whereas

DETAILED DESCRIPTION OF THE PREFERRED EMBODIMENTS

Hereinafter, specific preferred embodiments of the present invention will be described with reference to the accompanying drawings to clarify the present invention.

Figure 1A:
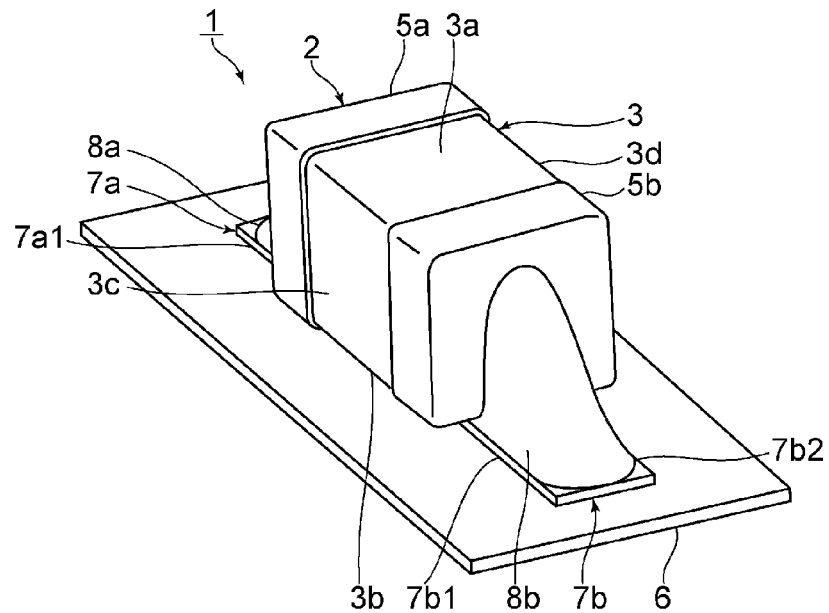
Figure 1B:
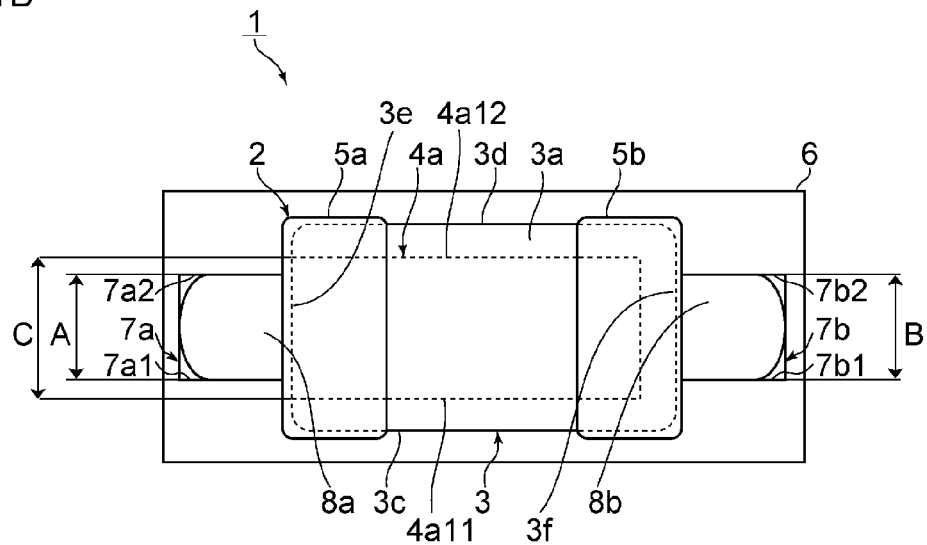
FIG. 1B is a plan view of the laminated ceramic electronic component mounting structure according to the first preferred embodiment of the present invention.
Figure 2A:
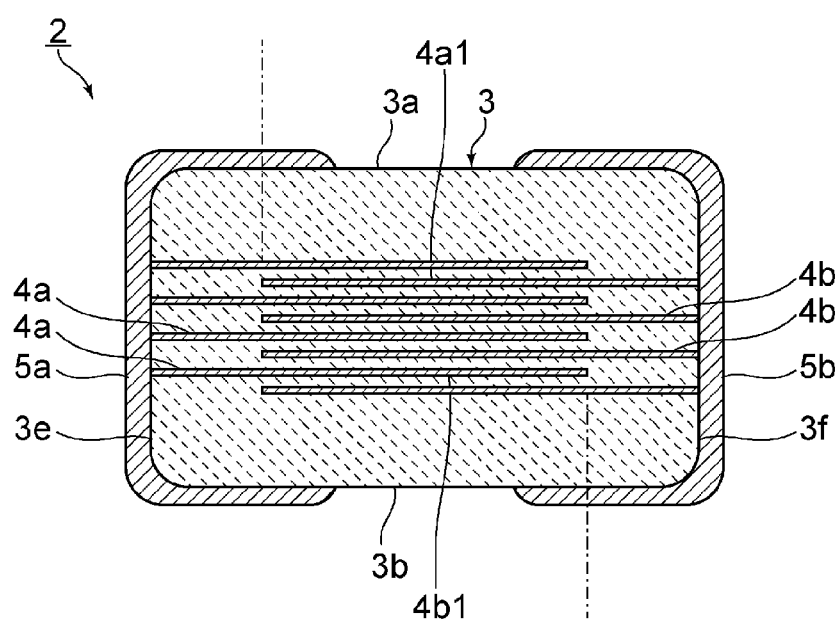
Figure 2B:
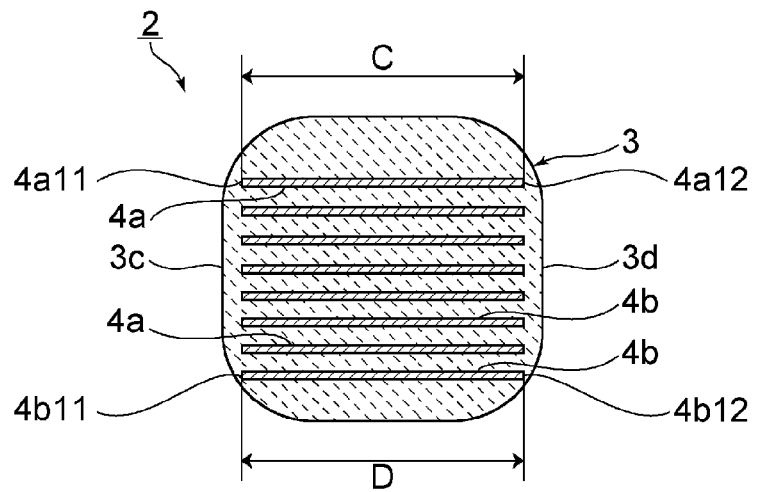
FIG. 2B is an end surface-direction cross-sectional view of the laminated ceramic electronic component cut at a location thereof where no terminal electrodes are present in the first preferred embodiment of the present invention.

FIGS. 1A and 1B are a perspective view and a plan view, respectively, of the laminated ceramic electronic component mounting structure according to the first preferred embodiment of the present invention. FIGS. 2A and 2B are a side cross-sectional view of a laminated ceramic electronic component in the first preferred embodiment of the present invention and an end surface-direction cross-sectional view of the laminated ceramic electronic component cut at a location thereof where no terminal electrodes are present.

A laminated ceramic electronic component mounting structure 1 includes a laminated ceramic electronic component 2. The laminated ceramic electronic component 2 includes a ceramic body 3. The ceramic body 3 includes first and second principal surfaces 3a and 3b, first and second side surfaces 3c and 3d, and first and second end surfaces 3e and 3f. The first and second principal surfaces 3a and 3b extend along the length and width directions of the ceramic body 3 and are opposed to each other. The first and second side surfaces 3c and 3d extend along the length and thickness directions of the ceramic body 3 and are opposed to each other. The first and second end surfaces 3e and 3f extend along the length and thickness directions of the ceramic body 3 and are opposed to each other.

In the present preferred embodiment, the ceramic body 3 preferably is composed of a high-dielectric ceramic material, for example. Examples of the high-dielectric ceramic material include $BaTiO_3$, $CaTiO_3$ and $SrTiO_3$. Note that an accessory constituent, such as an Mn compound, an Fe compound, a Cr compound, a Co compound or an Ni compound, may be added as appropriate to the ceramic body 3. In addition, the ceramic body 3 may contain Si, glass, and the like.

As illustrated in FIG. 2A, first and second inner electrodes 4a and 4b are disposed within the ceramic body 3. The first and second inner electrodes 4a and 4b include opposed portions 4a1 and 4b1. The first and second inner electrodes 4a and 4b are opposed to each other in the thickness direction at the opposed portions 4a1 and 4b1.

As illustrated in FIG. 2B, the first inner electrode 4a includes third and fourth widthwise edges 4a11 and 4a12 at the opposed portions. Likewise, the second inner electrode 4b includes third and fourth widthwise edges 4b11 and 4b12 at the opposed portions.

Referring back to FIG. 1B, first and second terminal electrodes 5a and 5b are disposed on the first and second end surfaces 3e and 3f of the ceramic body 3.

In the present preferred embodiment, the lengthwise dimensions of the ceramic body 3 are larger than the widthwise dimensions thereof. That is, the first and second terminal electrodes 5a and 5b are disposed so as to face each other in the longitudinal direction of the ceramic body 3. Note that the lengthwise dimensions of the ceramic body 3 may be shorter than the widthwise dimensions thereof, and the first and second terminal electrodes 5a and 5b may be disposed so as to face each other in the latitudinal direction of the ceramic body 3.

As illustrated in FIGS. 1A and 1B, first and second electrode lands 7a and 7b are disposed on a circuit board 6. A laminated ceramic electronic component 2 is mounted on the first and second electrode lands 7a and 7b through joining materials 8a and 8b. The first terminal electrode 5a of the laminated ceramic electronic component 2 is electrically connected to the first electrode land 7a through the joining material 8a. Likewise, the second terminal electrode 5b is electrically connected to the second electrode land 7b through the joining material 8b. In the present preferred embodiment, the joining materials 8a and 8b preferably are composed of solder, for example. Note that where appropriate, the joining materials 8a and 8b may be composed of another metal for use as a brazing material, for example.

The joining materials 8a and 8b define fillets. The laminated ceramic electronic component 2 is mounted onto the circuit board 6 from the second principal surface 3b side. That is, in the present preferred embodiment, the second principal surface 3b corresponds to a mounting surface.

The first electrode land 7a includes first and second widthwise edges 7a1 and 7a2. Likewise, the second electrode land 7b includes first and second widthwise edges 7b1 and 7b2.

As illustrated in FIGS. 1B and 2B, a width A of the first electrode land 7a and a width B of the second electrode land 7b are smaller than widths C and D of the first and second inner electrodes 4a and 4b at opposed portions 4a1 and 4b2. In addition, the first and second widthwise edges 7a1, 7a2, 7b1 and 7b2 of the first and second electrode lands 7a and 7b are positioned on the widthwise inner side of the third and fourth widthwise edges 4a11, 4a12, 4b11, and 4b12 of the first inner electrode 4a in plan view. In other words, a pair of the widthwise edges 7a1 and 7a2 of the first electrode land 7a is positioned, in plan view, between a pair of the widthwise edges 4a11 and 4a12 of the opposed portion 4a1. Likewise, a pair of the widthwise edges 7b1 and 7b2 of the second electrode land 7b is positioned between a pair of the widthwise edges 4a11 and 4a12 of the opposed portion 4a1.

Note that "in plan view" refers to taking a view of the laminated ceramic electronic component mounting structure 1 from a direction perpendicular or substantially perpendicular to a surface of the circuit board 6 on which the laminated ceramic electronic component 2 is mounted. Plan views are observed as plain views represented by FIG. 1B.

In the present preferred embodiment, the widths of the first and second electrode lands 7a and 7b preferably are constant or substantially constant. Note that if the widths of the first and second electrode lands 7a and 7b are not constant, the widths A and B, when viewed from the end surface direction, refer to the widths of the first and second electrode lands 7a and 7b overlapping with the first and second terminal electrodes 5a and 5b.

One of the unique features of the present preferred embodiment is that the widths A and B are smaller than the widths C and D. In addition, in the present preferred embodiment, the first and second electrode lands 7a and 7b are positioned, in plan view, on the widthwise inner side of the opposed portions 4a1 and 4b1 of the first and second inner electrodes 4a and 4b, as described above. That is, the pair of the widthwise edges 7a1 and 7a2 of the first electrode land 7a is positioned between the pair of the widthwise edges 4a11 and 4a12 of the opposed portion 4a1, and the pair of the widthwise edges 7b1 and 7b2 of the second electrode land 7b is positioned between the pair of the widthwise edges 4a11 and 4a12 of the opposed portion 4a1. Conventionally, it has been considered to be desirable not to join the widthwise center of the ceramic body 3 since vibration at the widthwise center is large. A keen examination conducted by the inventors of the present application has proved, however, that to the contrary, biasing a junction area toward the widthwise center enables a further reduction of noise. The reason for this will be described hereinafter.

The lengthwise, widthwise and thickness dimensions of the ceramic body 3 of the present preferred embodiment preferably are about 1.15 mm, about 0.69 mm and about 0.68 mm, respectively, for example. Both the widths C and D of the opposed portions 4a1 and 4b1 of the first and second inner electrodes 4a and 4b preferably are about 0.527 mm, for example. The capacitance of the ceramic body 3 preferably is about 10 µF, for example. The circuit board 6 preferably is a glass epoxy substrate having a thickness of about 1.6 mm, for example. The lengthwise dimensions of the first and second electrode lands 7a and 7b preferably are about 1.5 mm, and the spacing between the first electrode land 7a and the second electrode land 7b preferably is about 0.5 mm, for example. The inventors of the present application fabricated a plurality of laminated ceramic electronic component mounting structures in the same way as in the present preferred embodiment but by varying the width A and equalizing the width B to the width A. Then, in each laminated ceramic electronic component mounting structure, the inventors evaluated an acoustic pressure of noise at a frequency of about 5.33 kHz at which the acoustic pressure extended its maximum peak.

Figure 3:
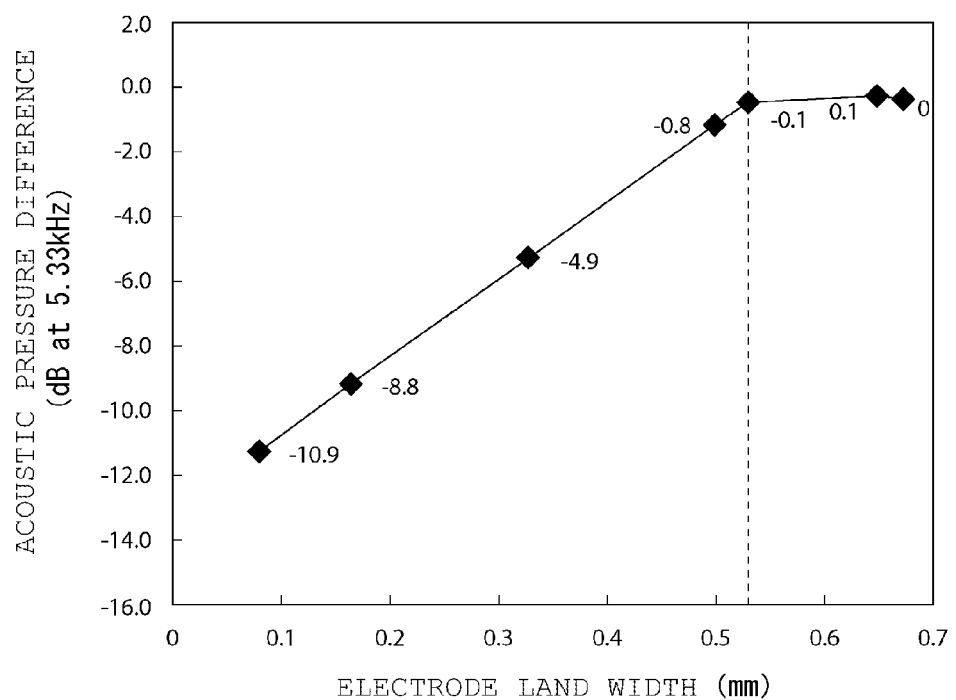
FIG. 3 is a graph illustrating the relationship between the width of an electrode land of the laminated ceramic electronic component mounting structure according to the first preferred embodiment of the present invention and a laminated ceramic electronic component mounting structure fabricated for comparison and an acoustic pressure difference of noise between acoustic pressure values at a width of about 0.67 mm.

FIG. 3 is a graph illustrating the relationship between the width of an electrode land of the laminated ceramic electronic component mounting structure according to the first preferred embodiment of the present invention and a laminated ceramic electronic component mounting structure fabricated for comparison and an acoustic pressure difference of noise between acoustic pressure values at a width of about 0.67 mm. Note that in FIG. 3, the difference between an acoustic pressure value at the width of each electrode land and an acoustic pressure value at a width of about 0.67 mm of the electrode land shown on the axis of abscissas is shown on the axis of ordinates as an acoustic pressure difference. The electrode land widths of the respective fabricated laminated ceramic electronic component mounting structures are about 0.081 mm, about 0.162 mm, about 0.324 mm, about 0.500 mm, about 0.527 mm, about 0.647 mm and about 0.670 mm.

The electrode land widths in FIG. 3 correspond to the widths A and B. If the widths A and B of an electrode land are larger than the widths C and D of first and second inner electrodes, no significant changes are observed in the acoustic pressure of noise. In contrast, if the widths A and B of an electrode land are smaller than the widths C and D of first and second inner electrodes, the acoustic pressure of noise is significantly low.

Hence, it is understood that the laminated ceramic electronic component mounting structure 1 according to the present preferred embodiment is capable of reducing noise further.

The reason for being able to reduce noise further as the result of the widths A and B being smaller than the widths C and D is considered to be as follows. Noise is caused by the vibration of an effective volume portion within the component. Decreasing the width of an electrode land causes the width of the joining portion between the terminal electrode and a substrate to become also smaller than the width of the effective volume portion, thus significantly reducing the amount of vibration transferred from the effective volume portion to the substrate. Noise is thus reduced further.

The laminated ceramic electronic component mounting structure 1 according to the present preferred embodiment is able to be suitably used to mount capacitor elements liable to noise generation. For example, the laminated ceramic electronic component mounting structure 1 is configured to be suitably used to mount high-capacitance capacitor elements, high-specific permittivity capacitor elements, capacitor elements including a large number of inner electrode layers, and capacitor elements including a thin dielectric layer. More specifically, the laminated ceramic electronic component mounting structure 1 is configured to be suitably used to mount capacitor elements having a capacitance of about 1 μF or higher, capacitor elements having a specific permittivity of about 3000 or higher, capacitor elements including 350 layers or more of inner electrodes, and capacitor elements including an approximately 1 μm or less-thick dielectric layer.

Preferably, the widthwise dimensions and the thickness dimensions of the ceramic body 3 differ from each other. The widthwise dimensions of the ceramic body 3 may be larger or smaller than the thickness dimensions thereof. Consequently, the orientations of the first and second principal surfaces 3a and 3b are easily identified when mounting the ceramic body 3. More preferably, the widthwise dimensions and the thickness dimensions of the ceramic body 3 differ by about 20% or more from each other, for example. Consequently, it is possible to more securely identify the orientations of the first and second principal surfaces 3a and 3b.

Figure 4A:
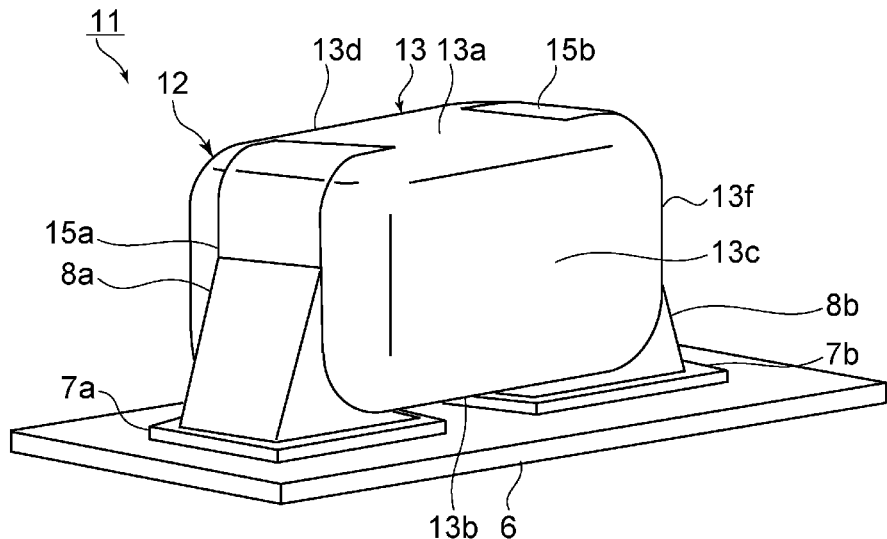
Figure 4B:
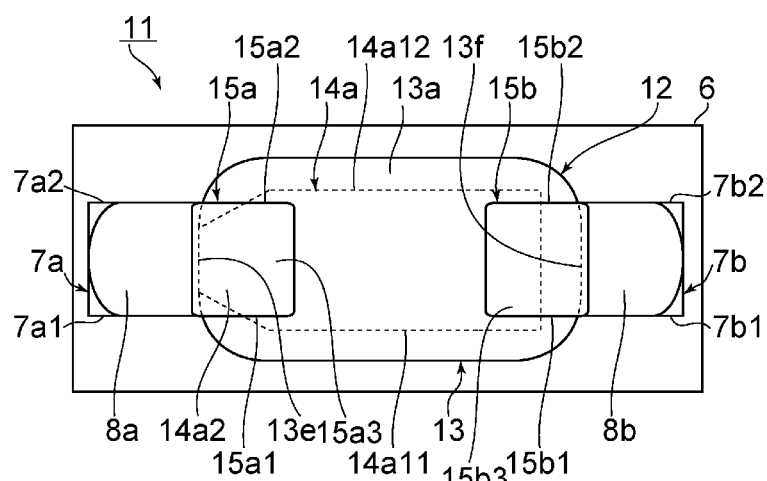
FIG. 4B is a plan view of the laminated ceramic electronic component mounting structure according to the second preferred embodiment of the present invention and FIG. 4C is a view taken from the end surface direction of a laminated ceramic electronic component in the second preferred embodiment of the present invention.
Figure 4C:
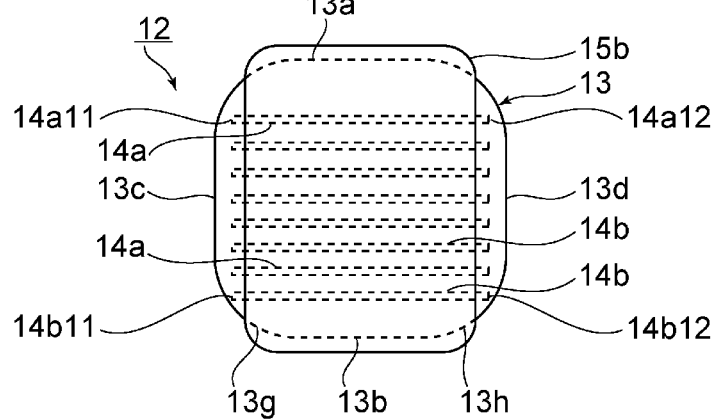
Figure 5:
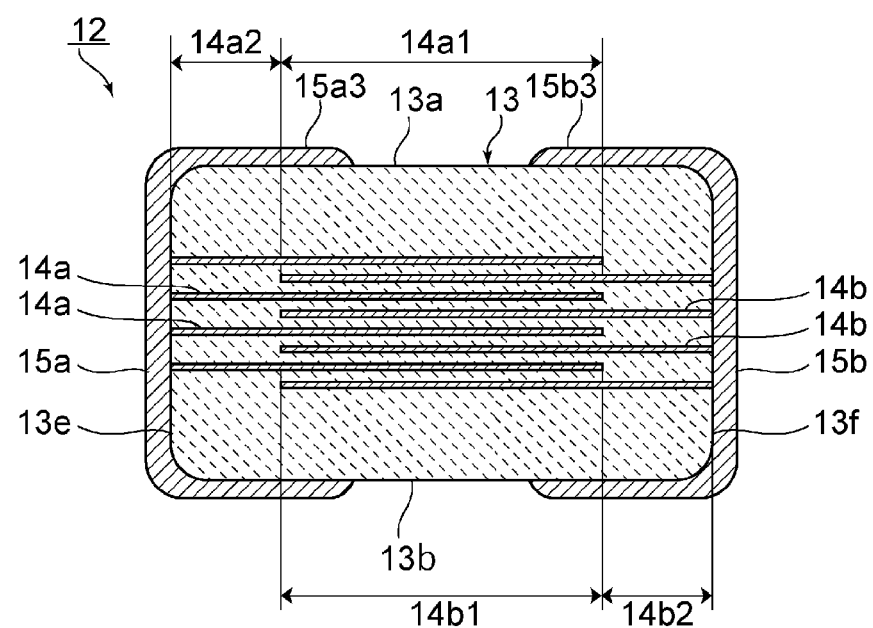
FIG. 5 is a side cross-sectional view of the laminated ceramic electronic component in the second preferred embodiment of the present invention.

FIGS. 4A, 4B, and 4C are a perspective view, a plan view, and a view taken from the end surface direction of the laminated ceramic electronic component, respectively, of a laminated ceramic electronic component mounting structure according to a second preferred embodiment of the present invention. FIG. 5 is a side cross-sectional view of a laminated ceramic electronic component in the second preferred embodiment of the present invention.

The first terminal electrode 15a of a laminated ceramic electronic component 12 of a laminated ceramic electronic component mounting structure 11 extends over a range from the first end surface 13e to the first and second principal surfaces 13a and 13b of a ceramic body 13 but not disposed on the first and second side surfaces 13c and 13d. Likewise, the second terminal electrode 15b extends over a range from the second end surface 13f to the first and second principal surfaces 13a and 13b of the ceramic body 13 but not disposed on the first and second side surfaces 13c and 13d.

As illustrated in FIG. 5, the first inner electrode 14a includes a lead-out portion 14a2 continuous with the opposed portion 14a1. The lead-out portion 14a2 of the first inner electrode 14a extends to the first end surface 13e of the ceramic body 13. Likewise, the second inner electrode 14b includes a lead-out portion 14b2 continuous with the opposed portion 14b1. The lead-out portion 14b2 of the second inner electrode 14b extends to the second end surface 13f of the ceramic body 13.

In the present preferred embodiment, the lead-out portion 14a2 of the first inner electrode 14a decreases in width over a range from a portion of the lead-out portion continuous with opposed portion 14a1 to the first end surface 13e of the ceramic body 13. Likewise, the lead-out portion 14b2 of the second inner electrode 14b decreases in width over a range from a portion of the lead-out portion continuous with the opposed portion 14b1 to the second end surface 13f of the ceramic body 13. Note that the widths of the lead-out portions 14a2 and 14b2 of the first and second inner electrodes 14a and 14b are not limited in particular.

Referring back to FIG. 4B, the first terminal electrode 15a includes first and second widthwise edges 15a1 and 15a2. The second terminal electrode 15b includes first and second widthwise edges 15b1 and 15b2. As illustrated in FIG. 4C, the first inner electrode 14a includes third and fourth widthwise edges 14a11 and 14a12. Likewise, the second inner electrode 14b includes third and fourth widthwise edges 14b11 and 14b12. In the present preferred embodiment, the first and second widthwise edges 15a1, 15b1, 15a2 and 15b2 of the first and second terminal electrodes 15a and 15b are positioned farther to the widthwise inner side of the ceramic body 13, in plan view, than the third and fourth widthwise edges 14a11, 14a12, 14b11 and 14b12 of the first and second inner electrodes 14a and 14b.

The width of the first terminal electrode 15a is smaller than the widths of the opposed portions 14a1 and 14b1. In addition, the width of the first terminal electrode 15a is larger than the width of a portion included in the first inner electrode 14a and led out from the opposed portion 14a1 to be exposed on the first end surface 13e in plan view. On the other hand, the width of the second terminal electrode 15b is smaller than the widths of the opposed portions 14a1 and 14b1. The width of the second terminal electrode 15b is larger than the width of a portion of the second inner electrode included in the second inner electrode 14b and led out from the opposed portions 14a1 and 14b1 to be exposed on the second end surface 13f.

In the present preferred embodiment, the first and second terminal electrodes 15a and 15b extend to the second principal surface 13b of the ceramic body 13. The first terminal electrode 15a includes a first overlapping portion 15a3 overlapping, in plan view, with the opposed portions 14a1 and 14b1. A pair of widthwise edges of the first overlapping portion 15a3 is positioned between a pair of the widthwise edges 14a11 and 14a12 of the opposed portions 14a1 and 14b1. The second terminal electrode 15b includes a second overlapping portion 15b3 overlapping, in plan view, with the opposed portions 14a1 and 14b1. A pair of widthwise edges of the second overlapping portion 15b3 is positioned between the pair of the widthwise edges 14a11 and 14a12 of the opposed portion 14a1.

The ceramic body 13 includes first and second ridge line portions 13g and 13h continuous with the second principal surface 13b and the first and second side surfaces 13c and 13d. In the present preferred embodiment, the first and second ridge line portions 13g and 13h are rounded, and the first and second terminal electrodes 15a and 15b extend to the first and second ridge line portions 13g and 13h. Accordingly, a gap is provided between the first and second electrode lands 7a and 7b and the first and second terminal electrodes 15a and 15b when the laminated ceramic electronic component is mounted on the circuit board 6. In addition, the first and second terminal electrodes 15a and 15b extend to ridge line portions on the second principal surface 13b side of the ceramic body 13. Accordingly, molten joining materials 8a and 8b go into the gap, thus forming fillets over a range from the ridge line portions on the second principal surface 13b side of the ceramic body 13 to the vicinity thereof. It is therefore possible to effectively stabilize the mounting position of the laminated ceramic electronic component 12.

Yet additionally, the first and second terminal electrodes 15a and 15b do not extend to the first and second side surfaces 13c and 13d on the second principal surface 13b which is a mounting surface. Accordingly, it is possible to restrict the formation of the fillets to a moderate extent. Consequently, even if adjacent laminated ceramic electronic components 12 come into contact with each other when a plurality of laminated ceramic electronic components 12 is mounted on the same circuit board 6, the first and second terminal electrodes 15a and 15b of the adjacent laminated ceramic electronic components 12 are unlikely to come into electrical contact with each other. It is therefore possible to further reduce the spacing between laminated ceramic electronic components 12 when mounting the laminated ceramic electronic components 12. Further reducing the spacing between laminated ceramic electronic components 12 causes vibrations transferred from the laminated ceramic electronic components 12 to the circuit board 6 to cancel each other. Noise is thus reduced further.

Note that the shape of portions of the first and second terminal electrodes 15a and 15b on the opposite side of the mounting surface may be the same as the shape of the first and second terminal electrodes 15a and 15b on the mounting surface side, as in the present preferred embodiment.

As illustrated in FIG. 4B, the first terminal electrode 15a of the laminated ceramic electronic components 12 overlaps, in plan view, with the first and second inner electrodes 14a and 14b in the present preferred embodiment. Likewise, the second terminal electrode 15b overlaps, in plan view, with the first and second inner electrodes 14a and 14b. The laminated ceramic electronic component 12 is therefore even less likely to break or crack. The reason for this will be described hereinafter.

Examples of a method for manufacturing a laminated ceramic electronic component include calcinating a raw ceramic body to obtain a ceramic body, and then coating and baking paste for electrodes on the ceramic body to form first and second terminal electrodes. In this case, tensile stress is applied to the ceramic body due to thermal contraction caused when the first and second terminal electrodes are calcinated. Accordingly, the laminated ceramic electronic component breaks or cracks in some cases.

The ceramic body 13 and the first and second terminal electrodes 15a and 15b of the laminated ceramic electronic component 12 according to the second preferred embodiment of the present invention preferably are formed in the same way as those of the above-described laminated ceramic electronic component. Also in the present preferred embodiment, tensile stress is applied to the ceramic body 13 due to a thermal contraction difference between the first and second terminal electrodes 15a and 15b and the ceramic body 13. Likewise, compressive stress is applied to the ceramic body 13 due to a thermal contraction difference between the first and second inner electrodes 14a and 14b and the ceramic body 13. In the present preferred embodiment, however, the first and second terminal electrodes 15a and 15b overlap, in plan view, with the first and second inner electrodes 14a and 14b. Accordingly, tensile stress applied to the ceramic body 13 is relieved by the compressive stress. The laminated ceramic electronic component 12 is therefore even less likely to break or crack.

Figure 6A:
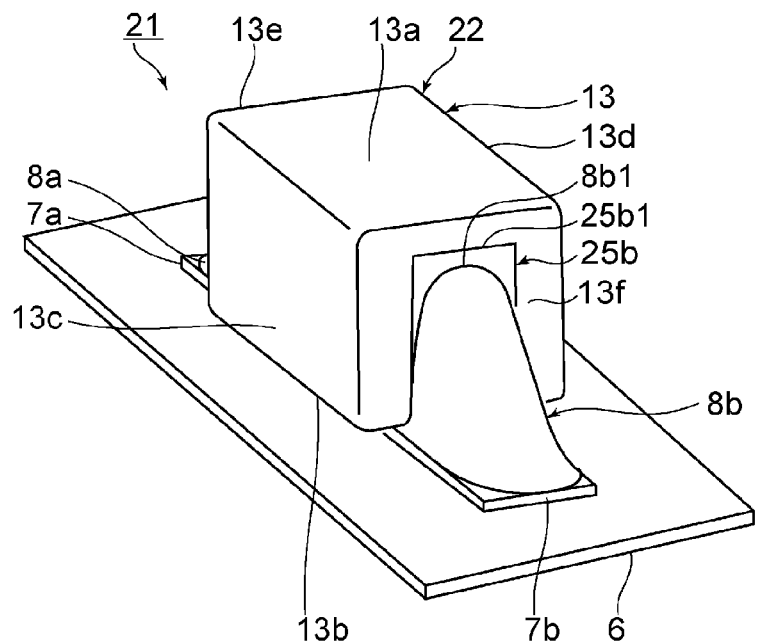
Figure 6B:
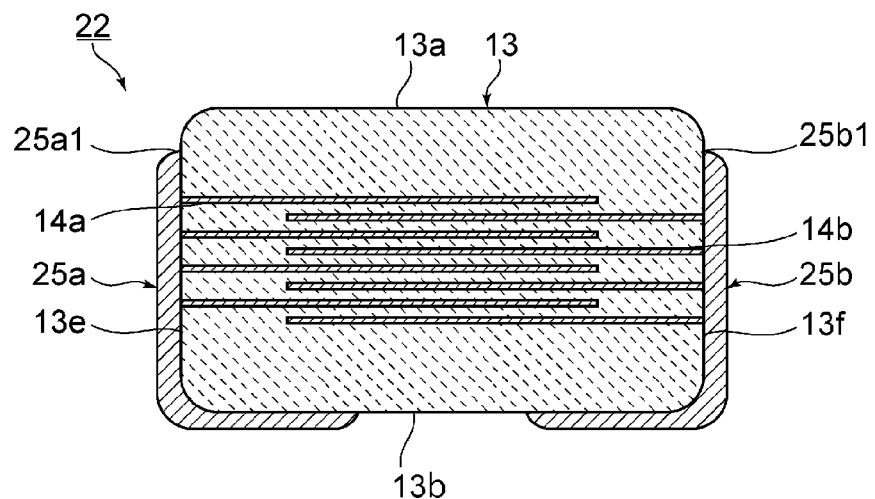
FIG. 6B is a side cross-sectional view of a laminated ceramic electronic component in the third preferred embodiment of the present invention.

FIGS. 6A and 6B are a perspective view of the mounting configuration of a laminated ceramic electronic component according to a third preferred embodiment of the present invention and a side cross-sectional view of the laminated ceramic electronic component.

In a laminated ceramic electronic component mounting structure 21 according to the present preferred embodiment, a first terminal electrode 25a extends over a range from the second principal surface 13b of the ceramic body 13 to the first end surface 13e but not disposed on the first principal surface 13a. Likewise, the second terminal electrode 25b extends over a range from the second principal surface 13b of the ceramic body 13 to the second end surface 13f but not disposed on the first principal surface 13a. The first and second terminal electrodes 25a and 25b include thickness edges 25a1 and 25b1, respectively.

When the laminated ceramic electronic component 22 is mounted on a circuit board 6, fillets resulting from joining materials 8a and 8b are formed on first and second electrode lands 7a and 7b on the circuit board 6. thickness edges 25a1 and 25b1 of the first and second terminal electrodes 25a and 25b are disposed on the first and second end surfaces 13e and 13f, respectively. Accordingly, the positions of a thickness edge of the joining material 8a and a thickness edge 8b1 of the joining material 8b are closer to the second principal surface 13b of the ceramic body 13 than the positions of the thickness edges 25a1 and 25b1 of the first and second terminal electrodes 25a and 25b, or the same as the positions of the thickness edges 25a1 and 25b1. That is, the positions of the thickness edge of the joining material 8a and the thickness edge 8b1 of the joining material 8b are adjusted by adjusting positions of the thickness edges 25a1 and 25b1 of the first and second terminal electrodes 25a and 25b. Consequently, it is possible to position the thickness edges 25a1 and 25b1 of the first and second terminal electrodes 25a and 25b, so as to be able to reduce noise.

Preferably, the first and second ridge line portions continuous with the second principal surface 13b and the first and second side surfaces 13c and 13d of the ceramic body 13 are rounded, and the first and second terminal electrodes 25a and 25b extend to the first and second ridge line portions. Consequently, also in the present preferred embodiment, it is possible to effectively stabilize the mounting position of the laminated ceramic electronic component 22, as in the second preferred embodiment. It is also possible to further reduce the spacing between laminated ceramic electronic components 22 when mounting the components.

Preferably, the first terminal electrode 25a of the laminated ceramic electronic component 22 overlaps, in plan view, with the first and second inner electrodes 14a and 14b. Likewise, the second terminal electrode 25b desirably overlaps, in plan view, with the first and second inner electrodes 14a and 14b. Consequently, the laminated ceramic electronic component 22 is even less likely to break or crack, as in the second preferred embodiment.

Note that the widths A and B of the electrode lands and the widths C and D of the inner electrodes are measured by, for example, grinding the laminated ceramic electronic component mounting structure from a direction perpendicular or substantially perpendicular to the end surfaces of the ceramic body, exposing cross-sections along the width and thickness directions of the structure, and observing the cross-sections by using an optical microscope.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A laminated ceramic electronic component mounting structure comprising:
   a laminated ceramic electronic component including:
      a ceramic body including first and second principal surfaces extending along lengthwise and widthwise directions of the laminated ceramic electronic component and opposed to each other, first and second side surfaces extending along the lengthwise and thickness directions of the laminated ceramic electronic component and opposed to each other, and first and second end surfaces extending along the widthwise and thickness directions of the laminated ceramic electronic component and opposed to each other;
      first and second inner electrodes located within the ceramic body and including opposed portions that are opposed to each other in the thickness direction;

a first terminal electrode extending over a range from the first end surface to the second principal surface and electrically connected to the first inner electrode; and a second terminal electrode extending over a range from the second end surface to the second principal surface and electrically connected to the second inner electrode; and a circuit board which includes first and second electrode lands electrically connected to the first and second terminal electrodes and on which the laminated ceramic electronic component is mounted from the second principal surface; wherein widths of the first and second electrode lands are smaller than widths of the opposed portions;

in a plan view, a pair of widthwise edges of the first electrode land is positioned between a pair of widthwise edges of the opposed portions and a pair of widthwise edges of the second electrode land is positioned between a pair of widthwise edges of the opposed portions;

the first inner electrode is led out to the first end surface to be connected to the first terminal electrode;

the second inner electrode is led out to the second end surface to be connected to the second terminal electrode;

dimensions of the ceramic body that extend in the lengthwise direction are larger than dimensions of the ceramic body that extend in the widthwise direction; and the laminated ceramic electronic component has a specific permittivity of about 3000 or higher.

2. The laminated ceramic electronic component mounting structure according to claim 1, wherein the first and second terminal electrodes do not extend to the first and second side surfaces of the ceramic body.

3. The laminated ceramic electronic component mounting structure according to claim 2, wherein a width of the first terminal electrode is smaller than the widths of the opposed portions and larger than the width of a portion of the first terminal electrode included in the first inner electrode and led out from the opposed portions to be exposed on the first end surface, and a width of the second terminal electrode is smaller than the widths of the opposed portions and larger than the width of a portion of the second terminal electrode included in the second inner electrode and led out from the opposed portions to be exposed on the second end surface.

4. The laminated ceramic electronic component mounting structure according to claim 2, wherein the first and second terminal electrodes extend to the second principal surface of the ceramic body, the first terminal electrode includes a first overlapping portion overlapping, in plan view, with the opposed portions, a pair of widthwise edges of the first overlapping portion is positioned between a pair of widthwise edges of the opposed portions, the second terminal electrode includes a second overlapping portion overlapping, in plan view, with the opposed portions, and a pair of widthwise edges of the second overlapping portion is positioned between a pair of widthwise edges of the opposed portions.

5. The laminated ceramic electronic component mounting structure according to claim 2, wherein a thickness dimension of the ceramic body is different than a widthwise dimension of the ceramic body.

6. The laminated ceramic electronic component mounting structure according to claim 1, wherein the first and second terminal electrodes do not extend to the first principal surface of the ceramic body.

7. The laminated ceramic electronic component mounting structure according to claim 1, wherein the first terminal electrode extends over a range from the first end surface of the ceramic body to the first principal surface, and the second terminal electrode extends over a range from the second end surface of the ceramic body to the first principal surface.

8. The laminated ceramic electronic component mounting structure according to claim 1, wherein the first terminal electrode extends over a range from the first end surface of the ceramic body to the first principal surface and the first and second side surfaces, and the second terminal electrode extends over a range from the second end surface of the ceramic body to the first principal surface and the first and second side surfaces.

9. The laminated ceramic electronic component mounting structure according to claim 1, wherein a lengthwise dimension of the ceramic body is larger than a widthwise dimension of the ceramic body.

10. The laminated ceramic electronic component mounting structure according to claim 1, wherein the laminated ceramic electronic component is a capacitor.

11. The laminated ceramic electronic component mounting structure according to claim 1, wherein a thickness dimension of the ceramic body is different than a widthwise dimension of the ceramic body.

12. The laminated ceramic electronic component mounting structure according to claim 11, wherein the thickness dimension of the ceramic body is different than the widthwise dimension of the ceramic body by about 20%.

13. The laminated ceramic electronic component mounting structure according to claim 1, wherein the first inner electrode includes a first lead-out portion continuous with a first of the opposed portions and extending to the first end surface of the ceramic body, and the second inner electrode includes a second lead-out portion continuous with a second of the opposed portions and extending to the second end surface of the ceramic body.

14. The laminated ceramic electronic component mounting structure according to claim 13, wherein the first lead-out portion decreases in width as the first lead-out portion gets closer to the first end surface.

15. The laminated ceramic electronic component mounting structure according to claim 1, wherein a width of the first terminal electrode is smaller than widths of the opposed portions.

16. The laminated ceramic electronic component mounting structure according to claim 1, wherein a width of the second terminal electrode is smaller than widths of the opposed portions.

17. The laminated ceramic electronic component mounting structure according to claim 1, wherein the ceramic body includes first and second ridge line portions continuous with the second principal surface and the first and second side surfaces.

18. The laminated ceramic electronic component mounting structure according to claim 17, wherein the first and second terminal electrodes extend to the first and second ridge line portions.

19. The laminated ceramic electronic component mounting structure according to claim 1, wherein the first and second terminal electrodes do not extend to the first and second side surfaces on the second principal surface that is a mounting surface.

\* \* \* \* \*